United States Patent [19]

Meyers et al.

[11] Patent Number: 4,710,589
[45] Date of Patent: Dec. 1, 1987

[54] HETEROJUNCTION P-I-N PHOTOVOLTAIC CELL

[75] Inventors: Peter V. Meyers, Green Lane, Pa.; Chung-Heng Liu, Princeton Junction, N.J.; Timothy J. Frey, Schwenksville, Pa.

[73] Assignee: Ametek, Inc., Paoli, Pa.

[21] Appl. No.: 922,122

[22] Filed: Oct. 21, 1986

[51] Int. Cl.$^4$ ............................................. H01L 31/06
[52] U.S. Cl. ................................ 136/258 PC; 136/255; 136/260; 136/264; 136/265; 357/16; 357/30; 357/59
[58] Field of Search ......... 136/255, 258 PC, 258 AM, 136/260, 264, 265; 357/16, 30, 59 D

[56] References Cited

U.S. PATENT DOCUMENTS

| | | | |
|---|---|---|---|
| 3,290,175 | 12/1966 | Cusano et al. | 136/255 |
| 4,035,197 | 7/1977 | Raychandhuri | 136/255 |
| 4,036,645 | 7/1977 | Pinder et al. | 136/260 |
| 4,072,541 | 2/1978 | Meulenberg, Jr. et al. | 136/255 |
| 4,345,107 | 8/1982 | Fulop et al. | 136/255 |

FOREIGN PATENT DOCUMENTS 1532616 11/1978 United Kingdom ................ 136/260

OTHER PUBLICATIONS

"Photovoltaic II-VI Compound Heterojunctions for Solar Energy Conversions", F. Buch, Ph.D. Thesis, Stanford Univ., Jun. 1976, pp. i-vii, 10-15 and 24-29.
"An Overview of Amorphous Silicon Solar Cell Development", D. E. Carlson, *14th IEEE PVSC*, 1980, pp. 291-297.
"Attainment of 10% Conversion efficiency in Amorphous Silicon Solar Cells", A. Catalano et al., *16th IEEE PVSC*, 1982, pp. 1421-1422.
"Characterization of Cadmium Sulfide/Copper Ternary Heterojunction Solar Cells", A. Rothwarf, Polycrystalline Thin Film Review Meeting, SERI, May 1983, p. 119-133, esp. p. 119.
"Methods for Measuring Solar Cell Efficiency Independent of Reference Cell or Light Source", K. A. Emery et al., *18th IEEE PVSC*, 1985, pp. 623-628.
Polycrystalline Thin-Films: FY 1985 Annual Report of SERI, K. Zweibel et al., Feb. 1986, Section 3.0, pp. 21-26.
Heterojuction Solar Cells–S. J. Fonash et al., an advance write-up of a book chapter for "Advances in Photovoltaics", by T. Coutts and J. Meakin, Eds., especially pp. 10-11 and Figure 5.
"Current Topics in Photovoltaics"–Edited by T. J. Coutts and J. D. Meakin, copyrighted in 1985, Chapter 1, Heterojunction Solar Cells, by S. J. Fonash et al., especially pp. 9-12, Academic Press (1985).
"Ternary II-VI, Compound Thin-Films for Tandem Solar Cell Applications", J. Kimmerle et al., *Thin Solid Films*, 126 (1985), pp. 23-29.
"Thin Film Tandem Solar Cells Based on II-VI Compounds", W. H. Bloss et al., *1984 IEEE PVSC*, pp. 715-720.

*Primary Examiner*—Aaron Weisstuch
*Attorney, Agent, or Firm*—Amster, Rothstein & Ebenstein

[57] ABSTRACT

A heterojunction p-i-n photovoltaic cell having at least three different semiconductor layers formed of at least four different elements comprises a p-type relatively wide band gap semiconductor layer, a high resistivity intrinsic semiconductor layer, used as an absorber of light radiation, and an n-type relatively wide band gap semiconductor layer. The intrinsic layer is in electrically conductive contact on one side with the p-type layer and on an opposite side with the n-type layer. First and second ohmic contacts are in electrically conductive contact with the p-type layer and the n-type layer, respectively.

21 Claims, 4 Drawing Figures

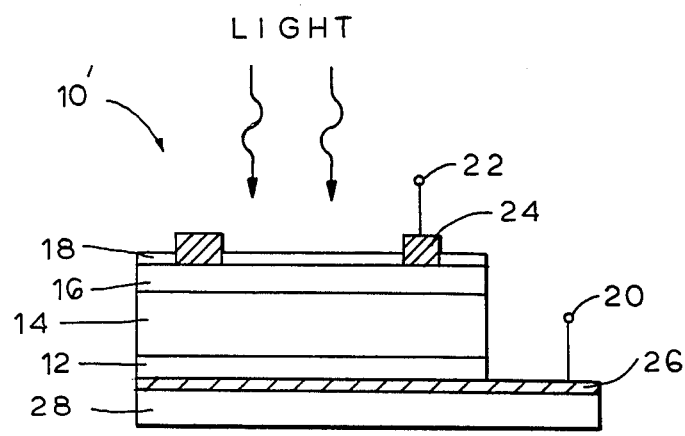
F I G. 3
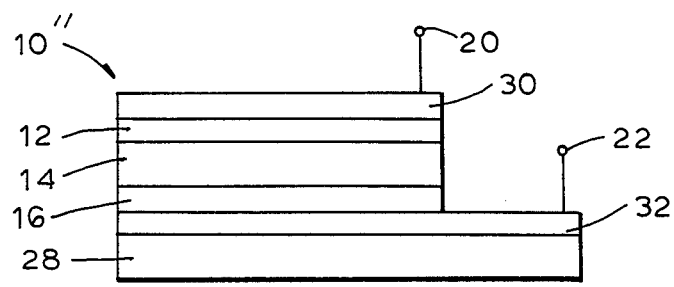
F I G. 4

HETEROJUNCTION P-I-N PHOTOVOLTAIC CELL

BACKGROUND OF THE INVENTION

The present invention relates to photovoltaic cells, and more particularly to a low cost, high efficiency heterojunction p-i-n photovoltaic cell.

Photovoltaic cells convert visible and near visible light energy to usable direct current electricity. Photovoltaic cells encompass solar cells which convert the visible and near visible light energy of the sun to usable direct current electricity.

The known heterojunction photovoltaic cells utilize two semiconductor materials to produce a rectifying junction. The advantages of utilizing this design include the ability to choose materials with properties appropriate for each component of the device and the reduced necessity for compromise with the property requirements of other components of the device. An example of this is the use of a wide band gap "window" semiconductor material of one carrier type (e.g., an n-type) as a barrier layer on a more narrow band gap "absorber" semiconductor material of the opposite carrier type (e.g., a p-type). The amount of radiation absorbed (and therefore the electrical current generated in the device) increases with decreasing band gap width, while the diffusion potential obtainable within the device (and therefore the electrical voltage generated in the device) increases with band gap width. Thus, the absorber material is chosen to maximize the solar radiation absorbed and afford reasonable diffusion potential, while the window material is chosen to absorb a minimum amount of solar radiation. Further design considerations include consideration of the electrical conductivity, chemical stability, density of bulk and interface electron and hole traps and recombination centers, availability of suitable ohmic contacts, electron and hole (i.e., charge carrier) mobilities, electron and hole lifetimes, discontinuities in the valence and conduction bands at the interface, absorption coefficient, material cost, ease of deposition, chemical or environmental stability, preferred carrier type, and other attributes of semiconductors well known in the photovoltaic art.

The principle of the p-i-n structure involves the creation of a diffusion potential across a relatively wide, high resistivity intrinsic layer. This diffusion potential is generated by the p and n regions on either side of the intrinsic layer. A feature of this structure is that the light is absorbed within the field region, and thus photogenerated positive and negative charge carriers are field assisted toward the p and n regions, respectively. In a variation of this structure the band gap of the p or n semiconductor facing the incident radiation is increased to permit more solar radiation to be absorbed within the intrinsic layer. However, even this innovation falls short of fully exploiting the flexibility of design available to producers of heterojunction photovoltaic cells. The p-i-n structure has been utilized in both amorphous and single crystal devices. Single crystal devices have been eschewed, possibly due to the high cost of single crystal materials and the difficulty of depositing them. P-i-n solar cells have been constructed to amorphous materials, but the carrier mobility and lifetime are low.

In addition, while heterojunction cells have been analyzed using the p-i-n model, no heterojunction devices of three or more layers (i.e., heterojunction p-i-n devices) have been produced heretofore.

Accordingly, it is an object of the present invention to provide a heterojunction p-i-n photovoltaic cell combining the ability to chose materials with properties appropriate for each component of the device with the ability to field assist the photogenerated charge carriers towards their respective regions.

Another object is to provide such a cell in which the cost of manufacturing the same is minimized and the photovoltaic efficiency (i.e., the ratio of electrical power output to radiant power input) is maximized.

A further object is provide such a cell using polycrystalline materials for some, and preferably all, of the semiconductor layers thereof.

It is also an object of the present invention to provide such a cell utilizing materials at each junction which minimize the presence of discontinuities or spikes in the energy band which is designed to carry charge carriers out of the absorber layer.

It is another object to provide such a cell having in particular embodiments a high efficiency level and a high optical transmission level.

SUMMARY OF THE INVENTION

It has now been found that the above and related objects of the present invention are obtained in a heterojunction p-i-n photovoltaic cell comprised of at least three different semiconductor layers and first and second ohmic contacts. The three different semiconductor layers are formed of at least four different elements and include a p-type relatively wide band gap semiconductor layer, a high-resistivity intrinsic semiconductor layer, used as an absorber of light radiation, and an n-type relatively wide band gap semiconductor layer, the intrinsic layer being in electrically conductive contact on one side with the p-type layer and on an opposite side of the n-type layer. The first and second ohmic contacts make electrical contact with the p-type layer and the n-type layer, respectively.

The compositions of the n-type, intrinsic, and p-type semiconductor layers are choosen so as to minimize spikes in the conduction band edge at the interface between the intrinsic layer and the n-type layer and the valence band edge at the interface between the intrinsic layer and the p-type layer. This is accomplished through the use of compositions for the intrinsic and p-type layers which have a common anion and (thereby to reduce spikes in the valence band) and compositions for the intrinsic and n-type layers which have a common cation (thereby to minimize spikes in the conduction band).

One or more intermediate layers may be disposed between the intrinsic layer and one, or both, of the p-type and n-type layers, the intrinsic layer being in electrically conductive contact with the one layer through the one or more intermediate layers.

In a preferred embodiment, at least one, and preferably all, of the semiconductor layers are polycrystalline and II-VI compounds. The p-type layer is ZnTe, the intrinsic layer is CdTe and the n-type layer is CdS. Generally, the n-type layer is CdS deposited by vacuum evaporation or, preferably, in a narrow gap reactor; the intrinsic layer is electrodeposited CdTe; and the p-type layer is vacuum evaporation deposited ZnTe.

The n-type layer is preferably deposited onto a transparent substrate comprising a transparent conducting oxide layer and a glass plate supporting the oxide layer, the oxide layer electrically connecting the n-type layer and the second ohmic contact.

The n-type and p-type layers are preferably devoid of common anions and common cations.

The cells of the present invention may achieve efficiencies greater than 10%.

BRIEF DESCRIPTION OF THE DRAWING

The above brief description, as well as further objects and features of the present invention, will be more fully understood by reference to the following detailed description of the presently preferred, albeit illustrative, embodiments of the present invention, when taken in conjunction with the accompanying drawing wherein:

FIG. 3 is a schematic side elevation view of a second embodiment thereof; and

FIG. 4 is a schematic side elevation view of a third embodiment thereof.

Figure 2:
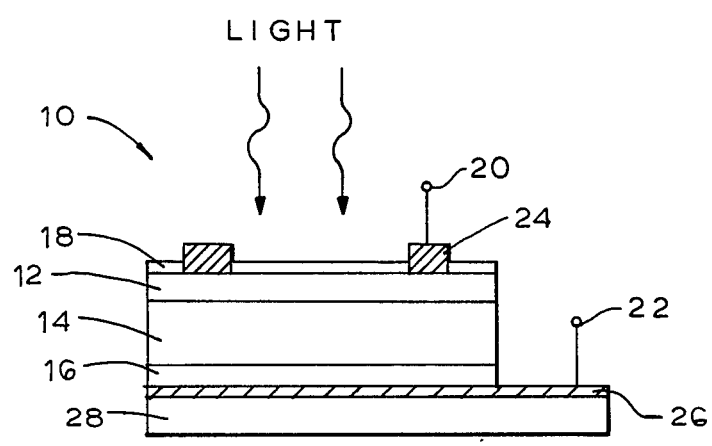
FIG. 2 is a schematic side elevation view of a first embodiment of a heterojunction p-i-n photovoltaic cell according to the present invention.

Layers are sectioned in FIGS. 2-4 to indicate non-transparency to the incident light.

DETAILED DESCRIPTION OF THE PREFERRED EMBODIMENTS

Figure 1:
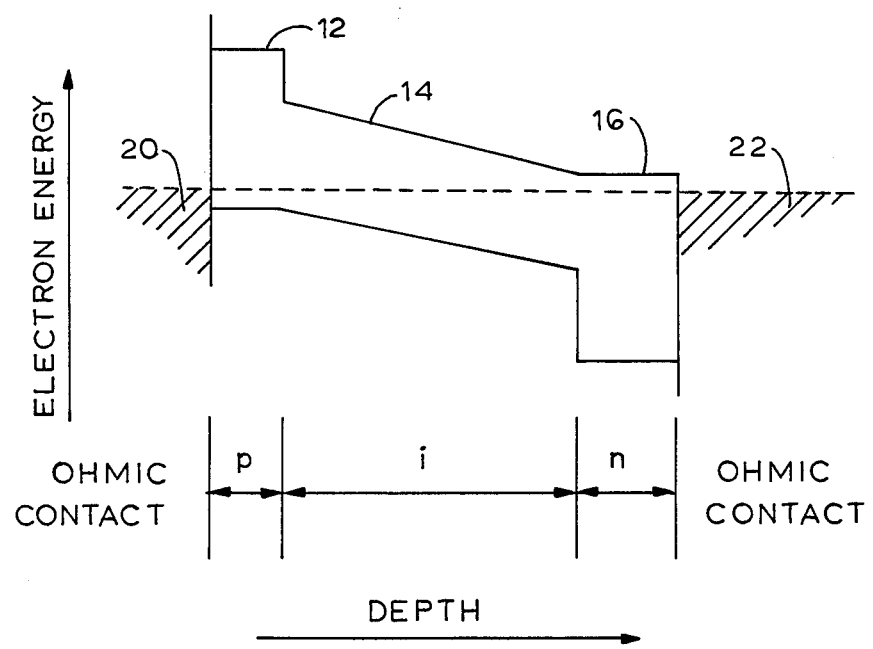
FIG. 1 is a schematic energy band diagram of a heterojunction p-i-n photovoltaic cell of the present invention.

Referring now to the drawing, and in particular to FIG. 1 thereof, therein illustrated is a schematic energy band diagram for a heterojunction p-i-n photovoltaic cell, such as those illustrated in FIGS. 2-4 and generally designated by the reference numerals 10, 10', and 10", respectively. The energy band diagram is a plot of the electron energy against the depth of the cell, in conventional fashion. The significance of the reference numerals appearing in FIG. 1 will become apparent from the following description of FIG. 2 wherein there is illustrated the first embodiment of a heterojunction p-i-n photovoltaic cell according to the present invention, generally designated by the reference numeral 10. The photovoltaic cell 10, which may find utility as a solar cell, is comprised of at least three different semiconductor layers and two ohmic contacts. The semiconductor layers are together composed of at least four different elements (exclusive of dopants) and include a p-type relatively wide band gap semiconductor layer 12, a high resistivity intrinsic semiconductor layer 14 used as an absorber of light radiation, and an n-type relatively wide band gap semiconductor layer 16. The p-type and n-type layers 12 and 16 are relatively wide band gap "window" layers relative to the narrow band gap "absorber" intrinsic layer. The intrinsic layer has an upper surface in electrically conductive contact with the p-type layer 12 and a bottom surface in electrically conductive contact with the n-type layer 16. The ohmic contacts 20 and 22 are in electrically conductive contact with the p-type and n-type layers 12 and 16, respectively. The term "ohmic contact", as used herein, refers to materials and structures which produce a low resistance junction with the relevant semiconductor material and allow current to pass freely into an external electrical circuit. It is anticipated that one or more intermediate layers may be required in order to more fully realize the benefits of this device. For example, intermediate layers might be inserted between either electrical contact 20 or 22 and semiconductor layers 12 or 16 in order to improve the quality of the contact, such as by passivating the semiconductor surface 12, 16, by reducing the contact resistance, or by increasing the physical or chemical stability of the interface.

The three semiconductor layers 12, 14, and 16 are preferably each polycrystalline in nature, such polycrystalline materials frequently being cheaper and more easily deposited than single crystalline materials and affording greater carrier mobility and lifetime than amorphous materials. Thus while amorphous and single crystalline materials are useful in the practice of the present invention, the polycrystalline materials are preferred.

Preferably the semiconductor layers 12, 14, and 16 are formed of the II-VI compounds well known for their utility in photovoltaic applications. While binary compounds are preferred, ternary compounds may also be used. More specifically, in the preferred embodiment ZnTe is employed as the p-type layer 12, CdTe as the intrinsic layer 14, the CdS as the n-type layer 16. Advantages of this specific configuration include the fact that CdS prefers to be n-type, ZnTe prefers to be p-type, and CdTe is self-compensating and thus prefers to be intrinsic. The intrinsic layer of CdTe may be electrodeposited on either the p-type layer or the n-type layer. The four different elements in these three semiconductor layers are Zn, Te, Cd, and S.

Furthermore, this embodiment has the advantage that n-type carriers (electrons) are reflected from the p-type layer by the discontinuity in the conduction band edge at the interface between the intrinsic and p-type layers, and that p-type carriers (holes) are reflected from the n-type layer by the discontinuity in the valence band edge at the junction between the intrinsic and n-type layers. This reflection has the effect of reducing the number of holes and electrons reaching the n-type and p-type regions, respectively, thus reducing the number of charge carriers lost via recombination in the n-type and p-type layers.

At the junction between two semiconductors in a photovoltaic cell, the presence of a discontinuity or spike in the energy band carrying the minority carrier of the absorbing layer may enhance recombination of that carrier and decrease the open circuit voltage of the device. To minimize such discontinuities, binary compund semiconductors often utilize compounds with at least one element in common on each side of the junction. Such binary compounds with a common cation would be expected to have a minimal discontinuity in the conduction band, while such binary compounds with a common anion would be expected to have a minimal discontinuity in the valence band. Thus, to minimize such discontinuities in the present invention, the p-i-n device 10 utilizes a common anion in the valence band edge between the intrinsic and p-type layers and a common cation in the conduction band edge between the intrinsic and n-type layers. On the other hand, it should be appreciated that in particular preferred devices the p-type layer and n-type layers share neither a common anion nor a common cation.

Although the interfaces between adjacent layers are depicted as abrupt in FIGS. 1 and 2, it is expected that real junctions may have a measurable width. Thus it is possible that some interdiffusion will occur at some time during device fabrication or use. This is to be expected especially in the case of junctions consisting of II-VI compound semiconductors which often form solid solutions. For example, the compounds ZnTe and CdTe may be viewed as the end points of the solid solution $Cd_{1-x}Zn_xTe$ at which x attains its limiting values of 1 and 0, respectively. Likewise the solid solution $CdS_{1-x}Te_x$ is known to exist in a continuum of stable compositions. The situation is similar for other compounds. Thus, many variations are possible, and the existence of graded interfaces is to be expected. The merits of such intentionally interdiffused interfaces are not known; however, it is possible that the degree of interdiffusion will affect, and possibly improve, the electrical, optical and chemical properties of the device.

Likewise, it is well known that at the interface between two semiconductor materials electron energy levels may exist which are different from those existing within either material. In some instances these energy levels, also called interface states, may have no effect on the operation of a solar cell; in other instances they may even be beneficial. In many cases, however, interface states are detrimental to the efficient operation of a solar cell. For example, interface states may become charged and thereby decrease the magnitude of the voltage drop, and therefore the penetration of the space charge region, within the absorber semiconductor. This has the effect of reducing both the current and the voltage generated by the solar cell. Alternatively, the interface states may serve as recombination centers for minority charge carriers with majority charge carriers, thus reducing the number of photogenerated carriers collected and therefore the current generated by the solar cell. For these reasons it may be desirable to passivate these interface states. This passivation may be accomplished by growing or depositing an intermediate layer at the interface between the two semiconductor materials. This intermediate layer might, for example, be composed of an oxide grown onto one of the semiconductors, i.e., a native oxide. Alternatively, the intermediate layer might be a compound with no elements in common with either semiconductor material. In any event, the application of such passivation layers is well known in the photovoltaic art. Thus, intermediate layers may be inserted between the intrinsic layer 14 and either or both of layers 12 and 16 for the purpose of passivating the interfaces therebetween, or of improving the electrical or optical coupling between layers, or of increasing the chemical or physical stability of the interface.

In this first embodiment 10, light is incident on the p-type layer 12, and so an anti-reflection coating 18 may be applied to the upper surface of the p-type layer 12 in order to increase the amount of light entering the device. A current collecting grid 24 on top of the p-type layer 12 is employed as part of the ohmic contact 20 and a conducting layer 26 below the n-type layer 16 is part of the ohmic contact 22. As illustrated in FIG. 2, the conducting layer 26 is non-transparent although a transparent layer could be employed if desired. The device (and in particular conducting layer 26) is supported on a substate 28 which, if desired, may serve as both physical support and as part of the ohmic contact 22.

Referring now to FIG. 3, therein illustrated is a second embodiment of the present invention, generally designated by the reference numeral 10', wherein the light is incident through the n-type layer 16. It will be appreciated that in this second embodiment 10' the three semiconductor layers are in reverse order from the first embodiment 10, with the n-type layer 16 on top, the intrinsic layer 14 therebelow, and the p-type layer 12 at the bottom. In this case the current collecting grid 24 is a component of the ohmic contact 22 in conductive contact with the n-type layer 16 and the non-transparent conducting layer 26 is part of the ohmic contact 20 in conductive contact with the p-type layer 12. The anti-reflection layer 18 is, of course, on top of the exposed upper surface of the n-type layer 16 rather than the p-type layer 12.

Referring now to FIG. 4, therein illustrated is a third embodiment of the present invention, generally designated by the reference numeral 10''. The third embodiment 10'' is similar to the first embodiment 10 except that the conductive grid 24 is replaced by a continuous conducting layer 30 as part of the ohmic contact 20 to the p-type layer 12, and the ohmic conducting layer 26 is replaced by a transparent conducting layer 32 as part of the ohmic contact 22 to the n-type layer 16. In this third embodiment 10'', the substrate 28 which in the first and second embodiments could, but need not be transparent, is necessarily transparent as the light is incident on the n-type layer 16 through the substrate 28 and conducting layer 32. If desired, an anti-reflection layer may be deposited on the exposed bottom face of the substrate layer 28. In the third embodiment 10'' the ohmic contact 30 to the p-type layer is formed of a material transparent to light of wavelength greater than that absorbed by the intrinsic layer 14. This allows a significant fraction of the radiant energy to pass through the device. This transmitted energy is then available for other applications. Specifically, the p-i-n device may then operate as the top cell in a cascade solar cell. Another lower band gap solar cell placed behind the top cell would then produce additional electrical energy, thus increasing the overall efficiency of the sunlight-to-electricity conversion.

Clearly many other possible variations are apparent to those skilled in the photovoltaic art. For example, in particular applications these devices may require ancillary features such as interconnections between cells, encapsulants, and additional structural supports necessary to incorporate these devices into modules or arrays.

To exemplify the manufacture of a typical cell, an ultrasonically cleaned low-sodium, borosilicate glass slide is coated with a transparent oxide front coating such as indium-tin-oxide or tin oxide. The Cds film is deposited on the coated glass substrate, for example, by vacuum deposition or by a narrow reaction gap process (as described in co-pending U.S. Patent Application Ser. No. 863,929, filed May 15, 1986). The vacuum deposited layer may be about 1 $\mu$m while the narrow reaction gap process deposited layer is about 1500 Å. CdTe is electrodeposited from an aqueous bath containing cadmium and tellurium ions using techniques fully described in U.S. Pat. No. 4,260,427. The composite structure is then heat treated, and the CdTe is given a bromine-methanol etching rinse to prepare it for ZnTe deposition. In certain instances, a further preparation of the surface may be effected by soaking it in a sodium sulfate/potassium hydroxide solution and rinsing it in deionized water. ZnTe is evaporated in a vacuum onto the rinsed surface to the desired thickness (for example, 0.06 $\mu$m to 0.15 $\mu$m). Finally, vacuum evaporated gold, indium- tin-oxide, or a combination of either with silver-impregnated epoxy may be used as the ohmic back contact to the p-type layer of ZnTe.

Although devices produced to date have been composed of CdS prepared by vacuum evaporation, narrow gap reactor deposition, or conversion of Cd to CdS by solid-gas phase reaction between Cd and $S_2$ gas, CdTe prepared by electrodeposition, and ZnTe prepared by vacuum evaporation, the scope of the present invention encompasses use of a wide variety of means of depositing semiconductor materials. Examples of deposition procedures available include electrodeposition, chemical vapor deposition, close spaced sublimation, solid-gas reaction, spray pyrolysis, sputtering, liquid phase epitaxy, molecular beam epitaxy, and other techniques well known in the art.

It will be appreciated that generally the ohmic contact 20 in conductive contact with the p-type layer 12 may be gold, a silver-containing epoxy, an indium-tin-oxide component or like materials, depending on the intended application. Similarly, the ohmic contact 22 in conductive contact with the n-type layer 16 may be tin oxide, indium-tin-oxide, a silver-containing epoxy or like materials.

Examples of the fabrication of a p-i-n heterojunction photovoltaic cell using II-VI compound materials are given below. All property measurements were made using standard techniques or their substantial equivalents.

EXAMPLE I

A. CdS on $SnO_2$ coated glass substrate—CdS is deposited onto a $SnO_2$ coated glass substrate in a narrow reaction gap process as described in co-pending U.S. patent application Ser. No. 863,929, filed May 15, 1986. A mist comprised of 0.05M $CdCl_2$ and 0.055M thiourea in a nitrogen carrier gas is passed over a substrate heated to approximately 450° C. producing a uniform film of CdS approximately 1500 Å thick.

B. CdTe deposition and heat treatment—The CdTe layer is electrodeposited from an aqueous bath containing cadmium and tellurium ions using techniques fully described in U.S. Pat. No. 4,260,427. The composite structure is next dipped into a 1% solution of $CdCl_2$ in methanol and dried prior to being heated to 415° C., in air, for twenty minutes.

C. ZnTe deposition—ZnTe is thermally evaporated onto bromine-methanol etched CdTe in vacuum. The temperature of the CdTe/CdS/$SnO_2$/glass is kept at about 260° C. throughout the ZnTe deposition. Copper is co-evaporated as a dopant. The final ZnTe thickness is 600 Å.

D. Vacuum evaporated gold is used as the ohmic back contact to the ZnTe p-type layer.

E. Device properties, as measured under 100 mW/cm$^2$ of simulated AM1 solar insolation illuminated from the glass side, were:

| area | 2.0 mm$^2$ |
|---|---|
| short circuit current density | 21.6 mA/cm$^2$ |
| Open circuit voltage | 774 mV |
| fill factor | .64 |
| efficiency | 10.7% |

EXAMPLE II

A cell was prepared as in Example I except that silver-impregnated epoxy was applied both to the gold contact in order to reduce the sheet resistance of the back contact and to the $SnO_2$ surrounding the cell in order to reduce the series resistance of the front contact.

Efficiency of the cell was determined within a relative accuracy of 2% (i.e. 9.4±0.2%) according to the procedures described in "Methods for Measuring Solar Cell Efficiency Independent of Reference Cell or Light Source", Proceedings of the Eighteenth Photovoltaics Specialists Conference, IEEE, 10/85, pp. 623–28.

Device properties, as measured under simulated 100 mW/cm$^2$ of AM1.5 Global solar radiations, were:

| area | 4.1 cm$^2$ |
|---|---|
| short circuit current density | 21.8 mA/cm$^2$ |
| open circuit voltage | 686 mV |
| fill factor | .63 |
| efficiency | 9.4% |

EXAMPLE III

A cell was prepared as in Example II with the following exceptions:

1. Subsequent to the bromine-methanol rinse, the CdTe surface was soaked for five minutes in a 0.1N $Na_2S_2O_4$/45 wt% KOH solution and rinsed in deionized water.
2. The ZnTe was deposited at 300° C., to a thickness of 1000 Å.
3. No gold contact was deposited. Instead a layer of ITO (indium-tin-oxide) 1000 Å thick was deposited.
4. The silver impregnated epoxy was applied only at the perimeter of the ITO contact. Although this reduces its effectiveness at reducing the series resistance, this allows light of wavelength greater than that corresponding to the CdTe bandgap (865 nm) to pass through the entire device.

Device properties, as measured under 100 mW/cm$^2$ simulated AM1 Direct solar insolation, were:

| area | 1.44 cm$^2$ |
|---|---|
| short circuit current density | 22.9 mA/cm$^2$ |
| open circuit voltage | 688 mV |
| fill factor | .44 |
| efficiency | 6.9% |

In addition, the optical transmission at 900 nm was 32%, an important property where the cell is to be used as part of a cell cascade.

EXAMPLE IV

A cell was prepared as in Example II with the following exceptions:

1. Subsequent to the bromine-methanol rinse, the CdTe surface was soaked for three minutes in 0.1N $NaS_2O_4$/45 wt% KOH at 50° C. and rinsed in deionized water.
2. The ZnTe was deposited at 300° C. to a thickness of 1000 Å.

Device properties, as measured under 100 mW/cm$^2$ simulated AM1 direct insolation, were:

| area | 2.0 mm$^2$ |
|---|---|
| short circuit current density | 21.6 mA/cm$^2$ |
| open circuit voltage | 737 mV |
| fill factor | .63 |
| efficiency | 10.0% |

In addition, electron beam induced current (ebic) measurements were performed on a fractured cross section of this device. This procedure is generally believed to produce a response at any point along the cross section which is proportional to the probability that a photo-induced electron-hole pair created at the corresponding depth in that device would contribute to the short circuit current. The ebic measurements show that substantially the entire thickness of the CdTe is active and that the maximum response occurs at approximately 0.5 μm from the CdTe/CdS interface. Note that if this device were a simple CdTe/CdS heterojunction, we would expect the peak ebic response close to the CdTe/CdS interface. Thus, it is hypothesized that the device must be either a buried homojunction, a p-i-n heterojunction, or some intermediate structure. The latter explanation seems most plausible, although the present invention is not to be limited by this theory.

EXAMPLE V

A. CdS on ITO coated glass substrate—In vacuum, CdS is thermally evaporated from a baffled tungsten boat onto an ultrasonically cleaned, low sodium, borosilicate glass slide coated with 0.2 μm indium-tin-oxide. The temperature of the substrate is maintained between 180°-220° C. during the deposition. The deposition rate is about 0.5 μm per minute, the thickness is in the 1 μm range. The deposited CdS is then heat treated at 400° C. for 30 minutes in a flowing hydrogen atmosphere in order to reduce the excess sulfur content.

B. CdTe deposition and heat treatment—The CdTe layer is electrodeposited from an aqueous bath containing cadmium and tellurium ions using techniques fully described in U.S. Pat. No. 4,260,427. The composite structure is then heat treated for one hour in air at 300° C.

C. ZnTe deposition—0.15 um ZnTe is thermally evaporated onto bromine-methanol etched CdTe in vacuum. The temperature of the CdTe/CdS/ITO/glass is kept at about 250° C. throughout the ZnTe deposition. Copper is co-evaporated as a dopant.

D. Vacuum evaporated gold is used as the ohmic back contact to the ZnTe p-type layer.

E. Device properties, as measured under 100 mW/cm² of simulated AM1 solar radiation illuminated from the glass side, were:

| area | 2 mm² |
| short circuit current density | 18 mA/cm² |
| open circuit voltage | 615 mV |
| fill factor | .47 |
| efficiency | 5.2% |

The present invention combines a minimization of cost of manufacture with a maximization of efficiency. Minimization of cost is achieved by the use of thin films (less than 10 microns thick) of selected component materials and by an efficient manufacturing process. More particularly, the use of II-VI compounds as component materials provides not only relatively low material cost, but also ease of deposition of the semiconductor layers. Maximization of efficiency is achieved by the proper selection of materials and the design of the photovoltaic cell. The materials are selected to minimize energy band discontinuities or spikes at the interfaces between semiconductors, and the cell design utilizes concepts which are known to produce efficient cells—namely, the p-i-n structure and the heterojunction interface. In particular embodiments, a high optical transmission level enables use of the cell in a cascade; in other particular embodiments an efficiency in excess of 10% is achieved.

Now that the preferred embodiments of the present invention have been shown and described in detail, various modifications and improvements thereon will become readily apparent to those skilled in the art.

Accordingly, the spirit and scope of the present invention are to be limited only by the appended claims, and not by the foregoing disclosure.

What is claimed is:

1. A heterojunction p-i-n photovoltaic cell having at least three layers of different semiconductor materials, composed together of at least four different elements, comprising:
   a p-type, relatively wide band gap semiconductor layer;
   a high resistivity intrinsic semiconductor layer, used as an absorber of light radiation;
   an n-type, relatively wide band gap semiconductor layer; said intrinsic layer being in electrically conductive contact on one side with said p-type layer and on an opposite side with said n-type layer; and
   first and second ohmic contacts in electrically conductive contact with said p-type layer and said n-type layer, respectively.

2. The photovoltaic cell of claim 1, wherein one or more intermediate semiconductor layers are disposed between said intrinsic layer and at least one of said p-type and n-type layers, said intrinsic layer being in electrically conductive contact with said at least one layer through said one or more intermediate layers.

3. The photovoltaic cell of claim 2, wherein one or more intermediate semiconductor layers are disposed between said n-type and intrinsic layers and between said intrinsic and p-type layers.

4. The photovoltaic cell of claim 1, wherein the compositions of said semiconductor layers are chosen so as to minimize spikes in the conduction band edge at the interface between said intrinsic layer and said n-type layer and in the valence band edge at the interface between said intrinsic layer and said p-type layer.

5. The photovoltaic cell of claim 4, wherein the composition of said intrinsic and p-type layers have a common anion and the composition of said intrinsic and n-type layers have a common cation, thereby to minimize spikes in the valence and conduction bands by use of compounds with common anions and cations, respectively.

6. The photovoltaic cell of claim 1, wherein at least one of said semiconductor layers is polycrystalline.

7. The photovoltaic cell of claim 6, wherein each of said semiconductor layers is polycrystalline.

8. The photovoltaic cell of claim 1, wherein at least one of said semiconductor layers is a II-VI compound.

9. The photovoltaic cell of claim 8, wherein each of said semiconductor layers is a II-VI compound.

10. The photovoltaic cell of claim 1, wherein said p-type layer is ZnTe, said intrinsic layer is CdTe, and said n-type layer is CdS.

11. The photovoltaic cell of claim 10, wherein each of said semiconductor layers is polycrystalline.

12. The photovoltaic cell of claim 10, wherein said intrinsic layer is electrodeposited CdTe.

13. The photovoltaic cell of claim 13, wherein said n-type layer is vacuum evaporation deposited CdS, and said p-type layer is vacuum evaporation deposited ZnTe.

14. The photovoltaic cell of claim 10, wherein said n-type layer is narrow gap reactor deposited CdS.

15. The photovoltaic cell of claim 14, wherein said intrinsic layer is electrodeposited CdTe, and said p-type layer is vacuum evaporation deposited ZnTe.

16. The photovoltaic cell of claim 14, wherein said CdS is deposited onto a transparent substrate comprising a transparent conducting oxide layer and a glass plate supporting said oxide layer, said oxide layer electrically connecting said n-type layer and said second ohmic contact.

17. The photovoltaic cell of claim 10, wherein said CdS is deposited onto a transparent substrate comprising a transparent conducting oxide layer and a glass plate supporting said oxide layer, said oxide layer electrically connecting said n-type layer and said second ohmic contact.

18. The photovoltaic cell of claim 1, wherein said n-type layer is deposited onto a transparent substrate comprising a transparent conducting oxide layer and a glass plate supporting said oxide layer, said oxide layer electrically connecting said n-type layer and said second ohmic contact.

19. The photovoltaic cell of claim 1, wherein said n-type and p-type layers are devoid of common anions and common cations.

20. The photovoltaic cell of claim 1, characterized by an efficiency greater than 10%.

21. A heterojunction p-i-n photovoltaic cell having at least three different semiconductor layers, composed together of at least four different elements, comprising:
- a p-type, relatively wide band gap semiconductor layer of a first polycrystalline II–VI compound;
- a high resistivity intrinsic semiconductor layer of a second polycrystalline II–VI compound, used as an absorber of light radiation;
- an n-type, relatively wide band gap semiconductor layer of a third polycrystalline II–VI compound; said intrinsic layer being in electrically conductive contact on one side with said p-type layer and on an opposite side with said n-type layer; and
- first and second ohmic contacts in electrically conductive contact with said p-type layer and said n-type layer, respectively.

* * * * *